US007772873B2

(12) United States Patent
Patterson

(10) Patent No.: US 7,772,873 B2
(45) Date of Patent: Aug. 10, 2010

(54) SOLID STATE THERMAL ELECTRIC LOGIC

(75) Inventor: Joseph Martin Patterson, Carlsbad, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 193 days.

(21) Appl. No.: 12/032,549

(22) Filed: Feb. 15, 2008

(65) Prior Publication Data

US 2009/0206911 A1 Aug. 20, 2009

(51) Int. Cl.
*H03K 19/00* (2006.01)
*H01C 7/10* (2006.01)

(52) U.S. Cl. ...................................... 326/16; 338/22 R

(58) Field of Classification Search .................. 326/16; 338/22 R

See application file for complete search history.

(56) References Cited

U.S. PATENT DOCUMENTS 3,651,379 A * 3/1972 Moisand et al. ............. 361/106
3,780,263 A * 12/1973 Kuzyk ........................ 219/501
6,700,766 B2 * 3/2004 Sato .......................... 361/93.1

* cited by examiner

*Primary Examiner*—Rexford N Barnie
*Assistant Examiner*—Thienvu V Tran
(74) *Attorney, Agent, or Firm*—Law Office of Gerald Maliszewski; Gerald Maliszewski

(57) ABSTRACT

A method is provided for thermal electric binary logic control. The method accepts an input voltage representing an input logic state. A heat reference is controlled in response to the input voltage. The method supplies an output voltage representing an output logic state, responsive to the heat reference. More explicitly, the heat reference controls the output voltage of a temperature-sensitive voltage divider. For example, the temperature-sensitive voltage divider may be a thermistor voltage divider.

18 Claims, 8 Drawing Sheets

SOLID STATE THERMAL ELECTRIC LOGIC

BACKGROUND OF THE INVENTION

1. Field of the Invention

This invention generally relates to binary logic circuitry and, more particularly, to a solid state logic device made from thermal electric components instead of semiconductor transistors.

2. Description of the Related Art

Three-element (cathode/grid/plate) triode tubes and transistors are widely understood electronic devices used for signal processing and logic operations. It is obvious the transistors are a cornerstone of modern technology. However, designers are beginning to bump against physical limitations associated with transistors which impede circuit size and performance. For example, transistor device sizes are limited by the thickness of the gate insulation that can be formed. However, thin oxide layers are sensitive to contamination and break down voltages. More generally, transistors are subject to failure when exposed to electromagnetic pulses (EMP), cosmic rays, electro-static discharge (ESD), and Alpha particle radiation. Further, many of the processes associated with conventional complementary metal oxide semiconductor (CMOS) integrated circuits (ICs) are complicated, use high process temperatures, involve the use of poisonous materials, and expensive fabrication equipment.

It would be advantageous if electronic switches and logic elements could be made with a technology other than solid state semiconductor transistors.

SUMMARY OF THE INVENTION

A solid state electronic switching device and circuit element is presented that requires no active semiconductor diodes, transistors, or vacuum tubes, and which can be configured into basic circuit blocks performing logic functions. The solid state switching circuit element can be fabricated without expensive semiconductor processing, is insensitive to contamination, and operates with a wide range of supply voltages, from volts down to the tens of millivolt range. The device is highly insensitive to EMP, cosmic rays, ESD, and Alpha particles. Because only lower temperature "back end" processing steps are utilized, multiple active layers and connective layers can be stacked vertically on the same substrate for 3D construction, permitting high density circuits to be fabricated. Since fewer steps are involved, fewer types of chemicals are used, and a lower volume of chemicals are required. Also, because of the lower temperatures, less energy is consumed in the manufacturing.

Thermistors are used for sensing and switching values. Thermal electric (TE) elements are used for selectively heating and cooling the thermistors in response to an input voltage. The thermistors are used to generate an output voltage responsive to temperature.

Accordingly, a method is provided for thermal electric binary logic control. The method accepts an input voltage representing an input logic state. A heat reference is controlled in response to the input voltage. The method supplies an output voltage representing an output logic state, responsive to the heat reference. More explicitly, the heat reference controls the output voltage of a temperature-sensitive voltage divider. For example, the temperature-sensitive voltage divider may be a thermistor voltage divider.

A thermal electric (TE) element is provided having a first mechanical interface and a second, opposite mechanical interface. One of the interfaces is electrically connecting the input voltage, while the opposite interface is electrically connected to a current source/drain. The thermistor voltage divider is located adjacent to one of the thermal electric element mechanical interfaces, and supplies a thermistor-divided voltage as the output voltage. If the input voltage represents a first logic state (e.g., logic high), the output voltage can be either the first logic state or a second logic state, opposite to the first logic state (e.g., logic low), depending on whether to logic circuit is configured as a buffer or an inverter.

Additional details of the above-described method and a temperature-based binary logic device are provided below.

DETAILED DESCRIPTION

Figure 1:
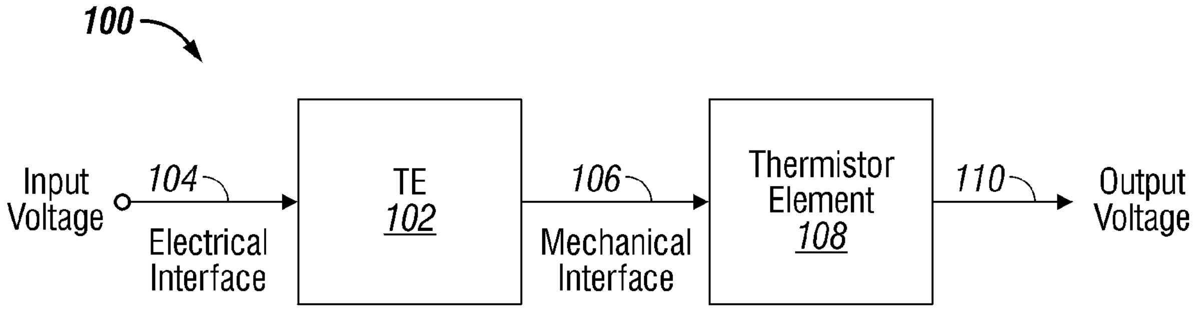
FIG. 1 is a schematic block diagram of a thermal electric binary logic device.

FIG. 1 is a schematic block diagram of a thermal electric binary logic device. The logic device 100 comprises a thermal electric (TE) element 102 having an electrical interface on line 104 to accept an input voltage representing an input logic state. TE element 102 has a temperature or mechanical interface 106 to supply a temperature responsive to the input voltage. A thermistor element 108 is adjacent the TE element mechanical interface 106, and has an output on line 110 to supply an output voltage representing an output logic state, responsive to temperature. If the TE element 102 electrical interface accepts an input voltage representing a first logic state, then the thermistor element 108 supplies an output voltage representing either the first logic state, or a second logic state, opposite to the first logic state. Whether the logic device 100 inverts the input logic state depends upon the arrangement of the TE element 102 and thermistor element 108, as explained in more detail below.

Figure 2:
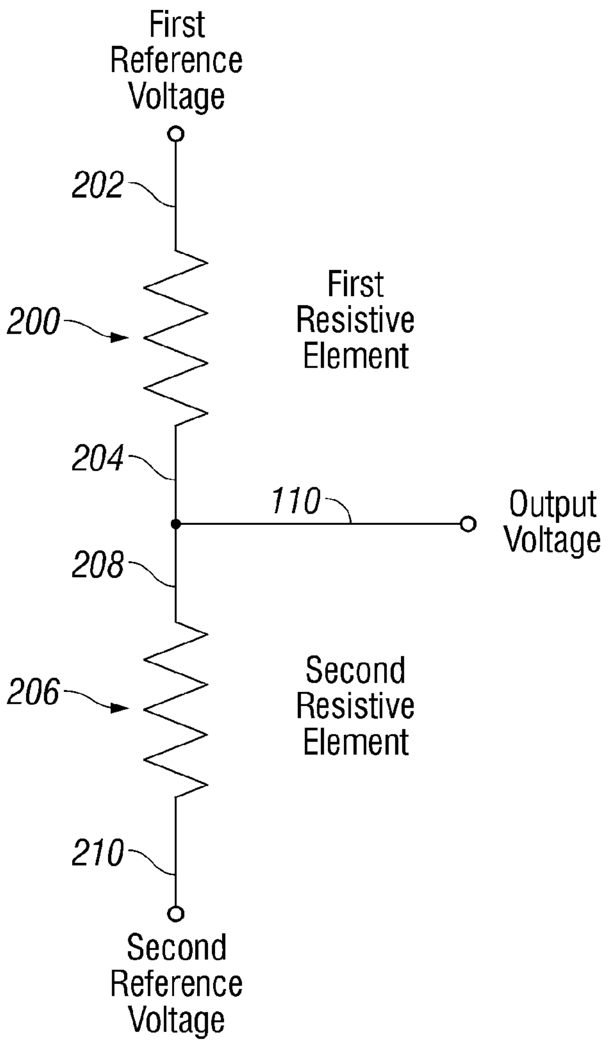
FIG. 2 is a diagram depicting the thermistor element of FIG. 1 in greater detail.

FIG. 2 is a diagram depicting the thermistor element of FIG. 1 in greater detail. Typically, the thermistor element 108 is a resistive voltage divider including at least one thermistor. Instead of a conventional thermistor, the device may be enabled with other elements (not shown) that change resistance, reactance, or susceptance in response to temperature changes. As shown, the resistive voltage divider includes a first resistive element 200 having a first end 202 connected to a first reference voltage and a second end 204 to supply the output voltage on line 110. A second resistive element 206 has a first end 208 connected to the first resistive element second end 204, and a second end 210 connected to a second reference voltage. The second reference voltage is different from the first reference voltage. For example, the first reference voltage may be 5 volts dc, and the second reference voltage may be ground. The first resistive element 200 may be a thermistor, the second resistive element 206 may be a thermistor, or both the first and second resistive elements may be thermistors. The thermistor, or thermistors may have positive, negative, linear, non-linear temperature coefficients, and if two thermistors are used, any combination of the above-mentioned temperature coefficients may be used.

For example, the first resistive element 200 may be a first thermistor having a temperature coefficient either a positive type temperature coefficient or a negative type temperature coefficient, and the second resistive element 206 is a second thermistor having a temperature coefficient type different than the first thermistor. This arrangement permits large output voltage swings.

Figure 3:
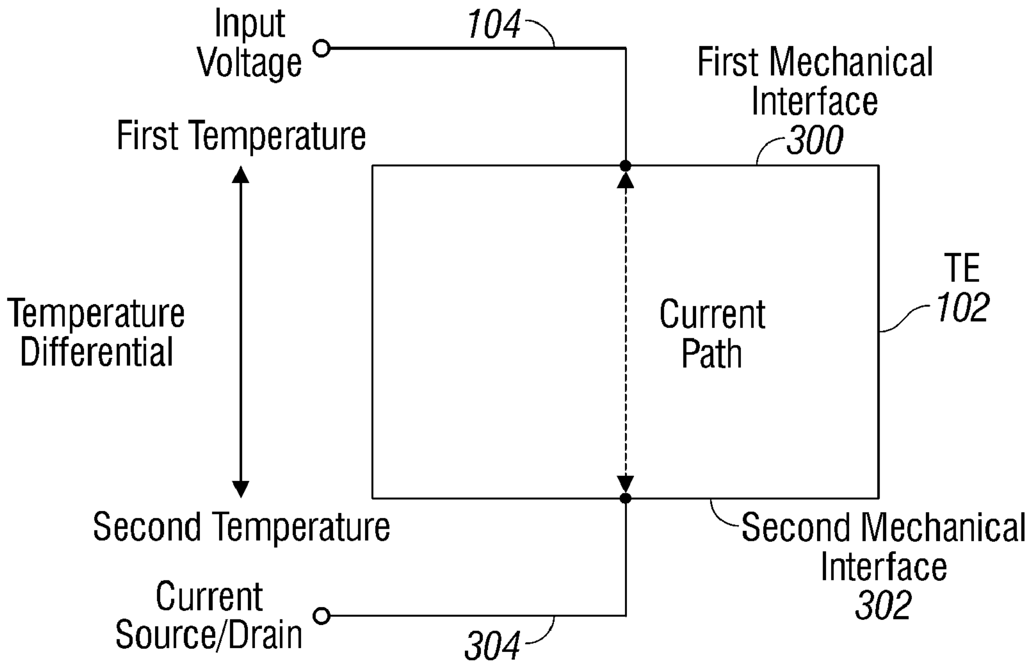
FIG. 3 is a diagram depicting the TE of FIG. 1 in greater detail.

FIG. 3 is a diagram depicting the TE of FIG. 1 in greater detail. The TE element mechanical interface includes a first mechanical interface 300 to supply a first temperature in response to the input voltage, and a second mechanical interface 302 to supply a second temperature in response to the input voltage. The second temperature is different than the first temperature. The TE element electrical interface includes an input electrically connected to one of the TE element mechanical interfaces, and the other mechanical interface is electrically connected to a current source/drain on line 304. Here, the input is shown connected to the first mechanical interface. However, in other aspects, the input may be electrically connected to the second mechanical interface. The temperature difference is due to heat changes resulting from electrical current flow. If current drains from the first mechanical interface 300 to the second 302 (the input voltage is higher than the voltage at the current source/drain), the first mechanical interface first temperature will be higher than the second mechanical second temperature. Likewise, if current sinks into the first mechanical interface 300 from the second 302 (the input voltage is lower than the voltage of the current source/drain), the first mechanical interface first temperature will be lower than the second mechanical second temperature.

As is well understood by those with skill in the art, electromotive force (emf) can be produced by purely thermal means in thermal electric element composed of two different metals with interfaces maintained at different temperatures. The two metals constitute a thermocouple, and the emf is called thermal emf. If the temperature at one interface is kept constant, the emf is a function of the temperature of the other interface. The emf arises from the fact that the density of free electrons in a metal differs from one metal to another and, in a given metal, depends on the temperature. When two different metals are connected to form two interfaces and the two interfaces are maintained at different temperatures, electron diffusion at the interfaces takes place at different rates. Conversely, if the interface temperatures are allowed to float, a voltage differential developed across the two interfaces creates a temperature differential across the interfaces. The heat transferred at an interface is proportional to the current passing through the interface, as is often referred to as Peltier heat.

In a single material wire whose ends are maintained at different temperatures, the free electron density varies from point to point. Each element of a wire of nonuniform temperature is therefore a source. When a current is maintained in a wire of nonuniform temperature, heat is liberated or absorbed at all points of the wire proportional to the quantity of electricity passing the section of wire and to the temperature difference between the ends of the section. Conversely, if the wire temperatures are allowed to float, a current passed through the wire creates a temperature difference between the ends of the wire.

Thus, the TE element may be thermal pile or thermocouple, with dissimilar metals stacked upon each other in an interdigitated stack. In one aspect, bismuth-telluride layer may be stacked between a metal such as copper. Although telluride is a semiconductor, it can be sputter deposited at low temperatures with the same equipment used for back end metal deposition processing. Alternately, the TE may be a stack of layers made from a single material.

Figure 4:
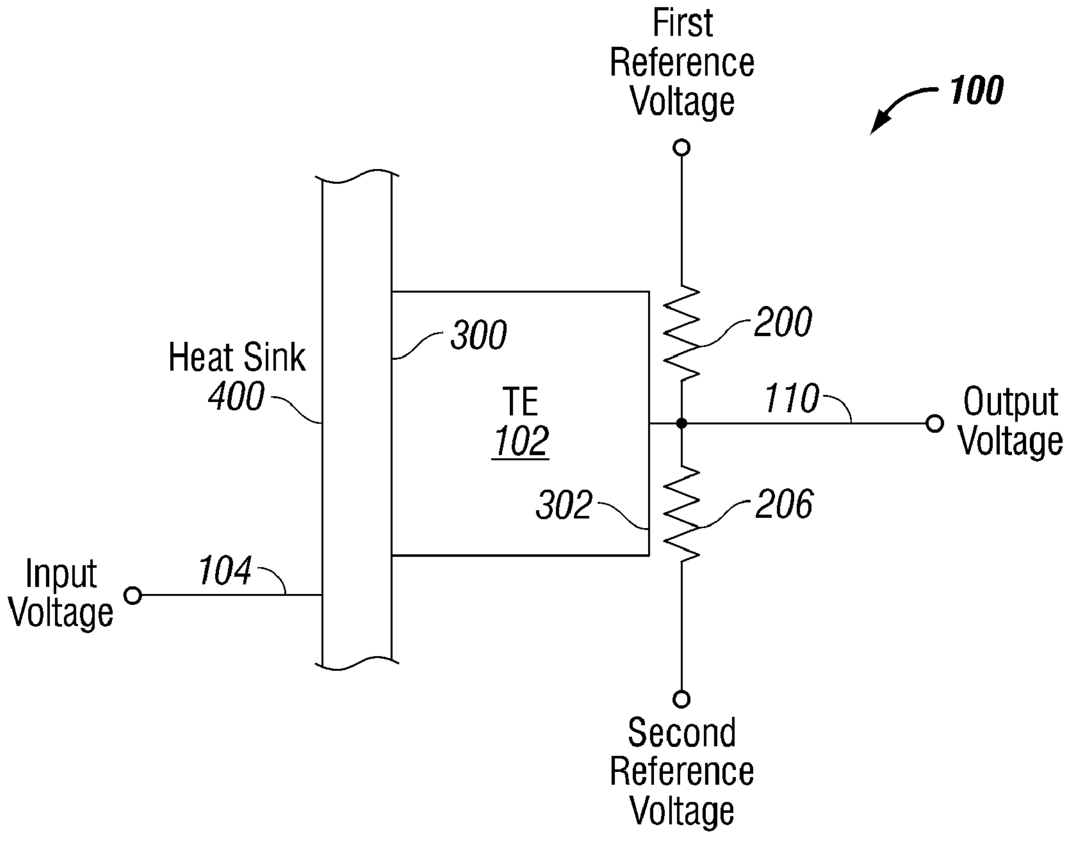
FIG. 4 is a schematic block diagram depicting a first implementation of the logic device of FIG. 1.

FIG. 4 is a schematic block diagram depicting a first implementation of the logic device of FIG. 1. As shown, the TE element first mechanical interface 300 is mounted on a thermally conductive heatsink 400. The heatsink 400 helps maintain the first mechanical interface 300 at a constant reference temperature, to help regulate the temperature range at the second mechanical interface 302, which in turn helps regulate the output voltage range on line 110. As shown, the TE element first mechanical interface 300 is electrically connected to the input voltage on line 104, through the electrically conductive heatsink 400. Assuming the first reference voltage is higher than the second reference voltage, if the first resistive element 200 is a positive coefficient thermistor and the second resistive element 206 is a negative coefficient thermistor 206, device 100 is a logic inverter.

Alternately but not shown, the TE 102 and heatsink may be separated by an electrical insulator and the input voltage is introduced directly to the first mechanical interface 300. The second mechanical interface is electrically connected to the first resistive element second end. As another alternative, the heatsink is not used. The variations of FIG. 4 may create a large voltage drop across the TE element to enhance the temperature differential and add to the output voltage swing.

Figure 5A:
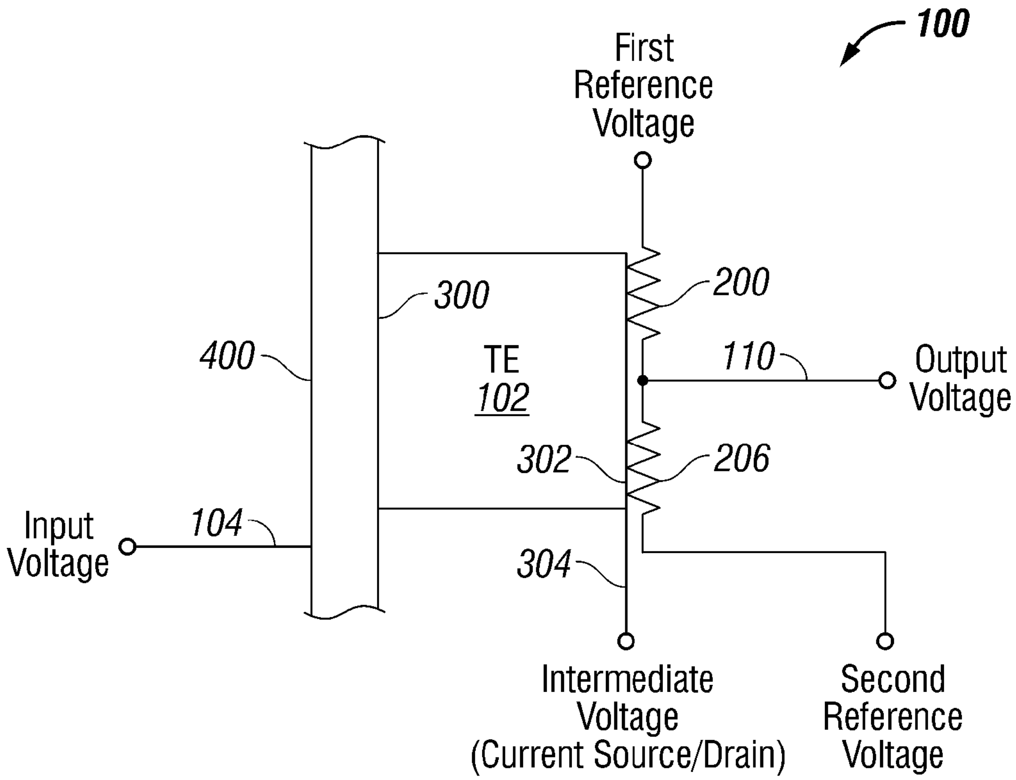
FIGS. 5A and 5B are schematic block diagrams depicting a second implementation of the logic device of FIG. 1.
Figure 5B:
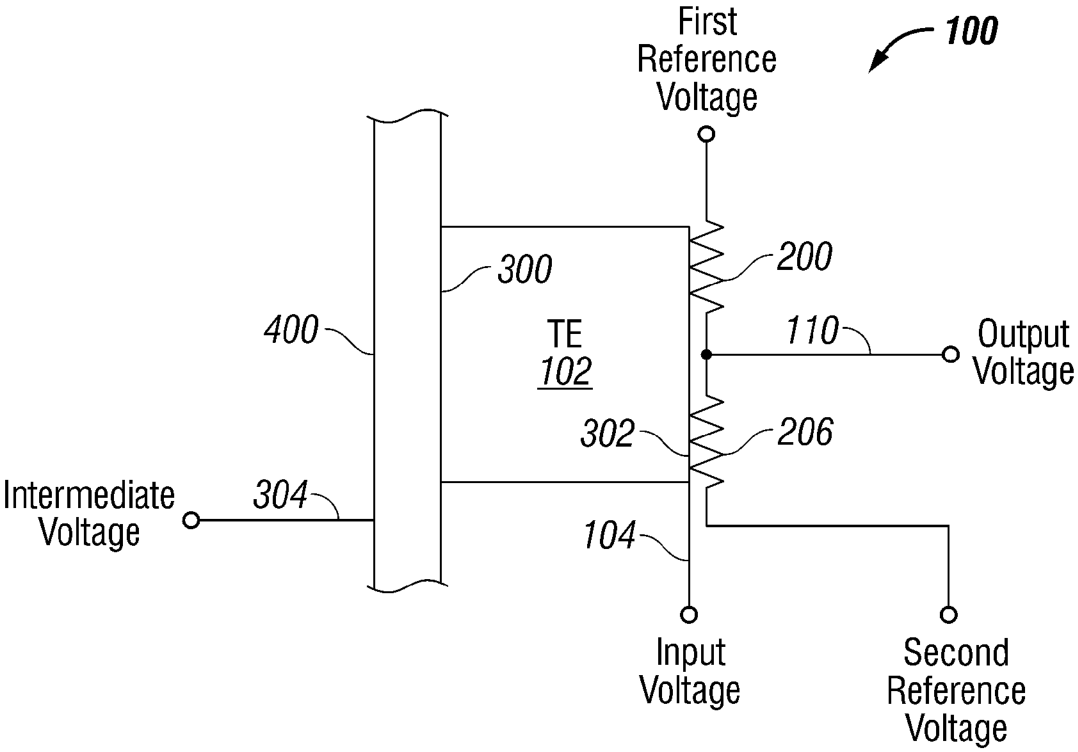

FIGS. 5A and 5B are schematic block diagrams depicting a second implementation of the logic device of FIG. 1. Assuming that the first mechanical interface 300 is connected to the input voltage, as in FIGS. 3 and 4, the TE element second mechanical interface in FIG. 5A is electrically connected to a current source/drain reference on line 304 having an intermediate voltage, approximately midway between an input logic high voltage and an input logic low voltage. In one aspect not shown, the second mechanical interface 302 is separated from the resistive elements 200 and 206 by a thermally conductive electrical insulator.

Assuming the first reference voltage is higher than the second reference voltage, if the first resistive element 200 is a positive coefficient thermistor and the second resistive element 206 is a negative coefficient thermistor 206, device 100 is a logic non-inverter (buffer). In response to a high input voltage, interface 302 decreases in temperature, causing the resistance across resistive element 200 to decrease, while the resistance across resistive element 206 increases. Alternately, if the first resistive element 200 is a negative coefficient thermistor and the second resistive element 206 is a positive coefficient thermistor 206, device 100 is a logic inverter.

Alternately as shown in FIG. 5B, the TE element second mechanical interface 302 is electrically connected to the input voltage and the first mechanical interface 300 is connected to the current source/drain. If the first resistive element 200 is a positive coefficient thermistor and the second resistive element 206 is a negative coefficient thermistor 206, device 100 is a logic inverter. Alternately, if the first resistive element 200 is a negative coefficient thermistor and the second resistive element 206 is a positive coefficient thermistor 206, device 100 is a logic non-inverter (buffer).

Figure 6A:
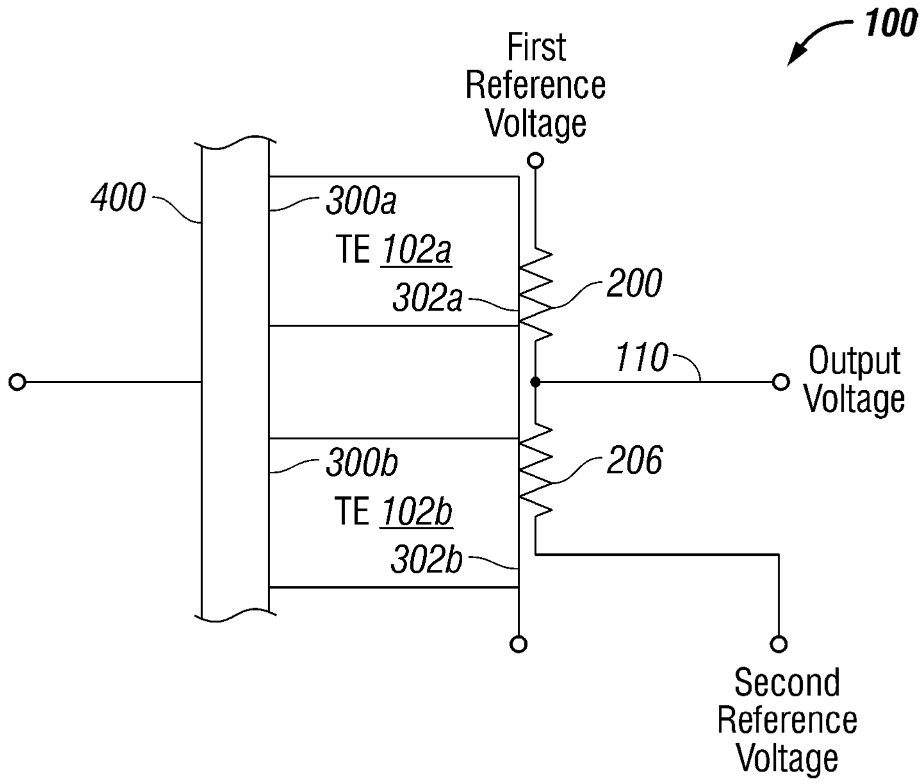
FIGS. 6A through 6D are schematic block diagrams depicting a third implementation of the logic device of FIG. 1 using two TEs.
Figure 6B:
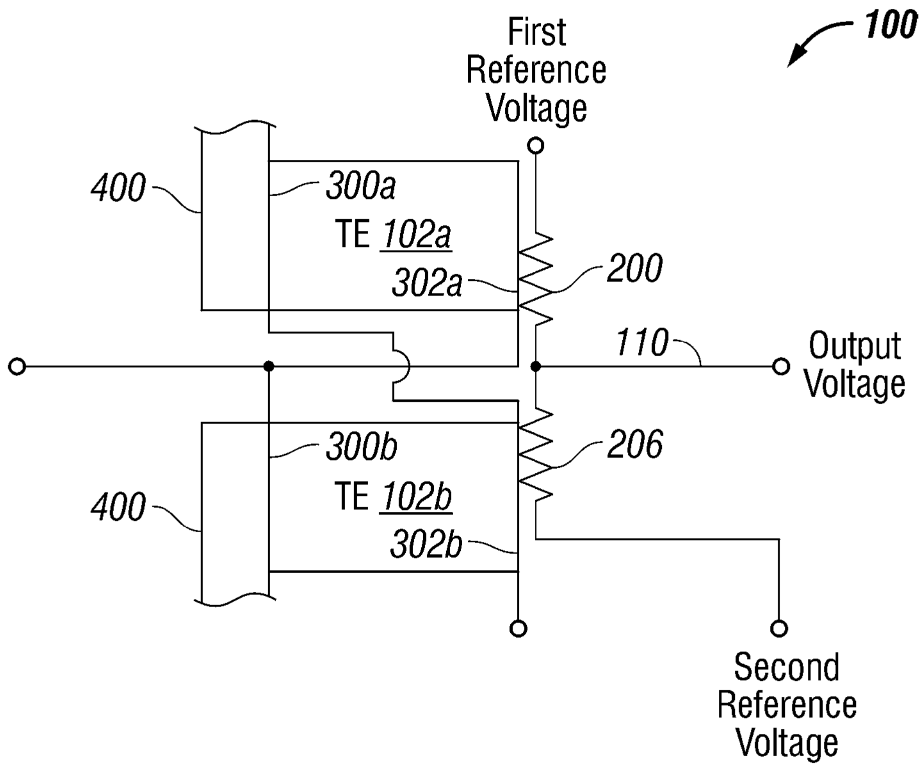

FIGS. 6A through 6D are schematic block diagrams depicting a third implementation of the logic device of FIG. 1 using two TEs. The TE element includes a first TE element 102*a* and a second TE element 102*b*. Each TE element has a first mechanical interface 300 to supply a first temperature in response to the input voltage, and a second mechanical interface 302 to supply a second temperature in response to the input voltage, different than the first temperature. The input voltage is electrically connected to one mechanical interface from each TE element, and the other mechanical interface of each TE element is electrically connected to a current source/drain. In FIGS. 6A and 6B, the TE element other mechanical interfaces are electrically connected to a current source/drain reference having an intermediate voltage, approximately midway between a logic high input voltage and a logic low input voltage.

The first resistive element 200 is adjacent the first TE element second mechanical interface 302*a* and the second resistive element 206 is adjacent the second TE element second mechanical interface 302*b*. Either resistive element may be a thermistor having a positive, negative, linear, or non-linear temperature coefficient. If both resistive elements are thermistors, they can be any combination of the above-mentioned coefficients.

As shown in FIG. 6A, the TE element first mechanical interfaces 300*a* and 300*b* are electrically connected together and the TE element second mechanical interfaces 302*a* and 302*b* are electrically connected together. If the first mechanical interfaces 300*a* and 300*b* are connected to the input voltage, then the second mechanical interfaces 302*a* and 302*a* are connected to the intermediate voltage current source/sink. If the first mechanical interfaces 300*a* and 300*b* are connected to the intermediate voltage current source/drain, then the second mechanical interfaces 302*a* and 302*a* are connected to the input voltage.

Alternately as shown in FIG. 6B, the first TE element 102*a* first mechanical interface 300*a* is electrically connected to the second TE element 102*b* second mechanical interface 302, and the first TE element 102*a* second mechanical interface 302*a* is electrically connected to the second TE element 102*b* first mechanical interface 300*b*. If mechanical interfaces 300*a* and 302*b* are connected to the input voltage, then mechanical interfaces 300*b* and 302*a* are connected to the intermediate voltage current source/sink. If mechanical interfaces 300*a* and 302*b* are connected to the intermediate voltage current source/drain, then mechanical interfaces 300*b* and 302*a* are connected to the input voltage.

The device of FIG. 6A acts similar to the devices of FIGS. 5A and 5B. The device of FIG. 6B presents the two resistive elements with different temperatures. For example, if the input voltage is introduced to mechanical interfaces 300*a* and 302*b*, an inverter can be made with two positive (or two negative) coefficient thermistors.

Figure 6C:
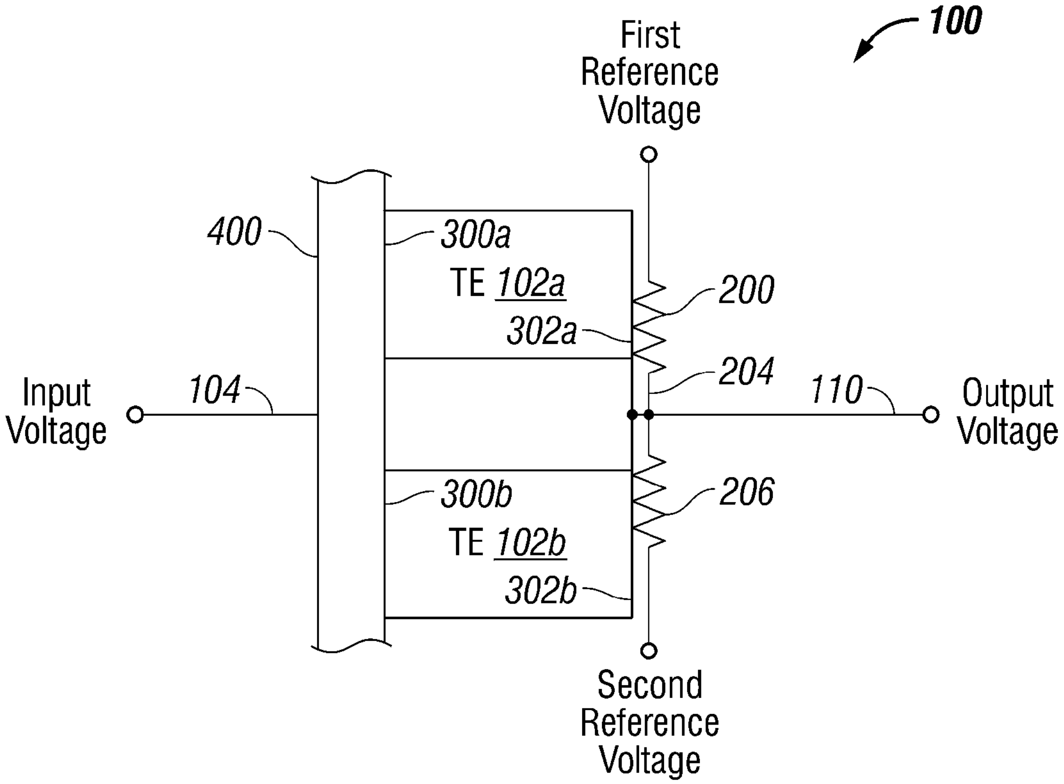
Figure 6D:
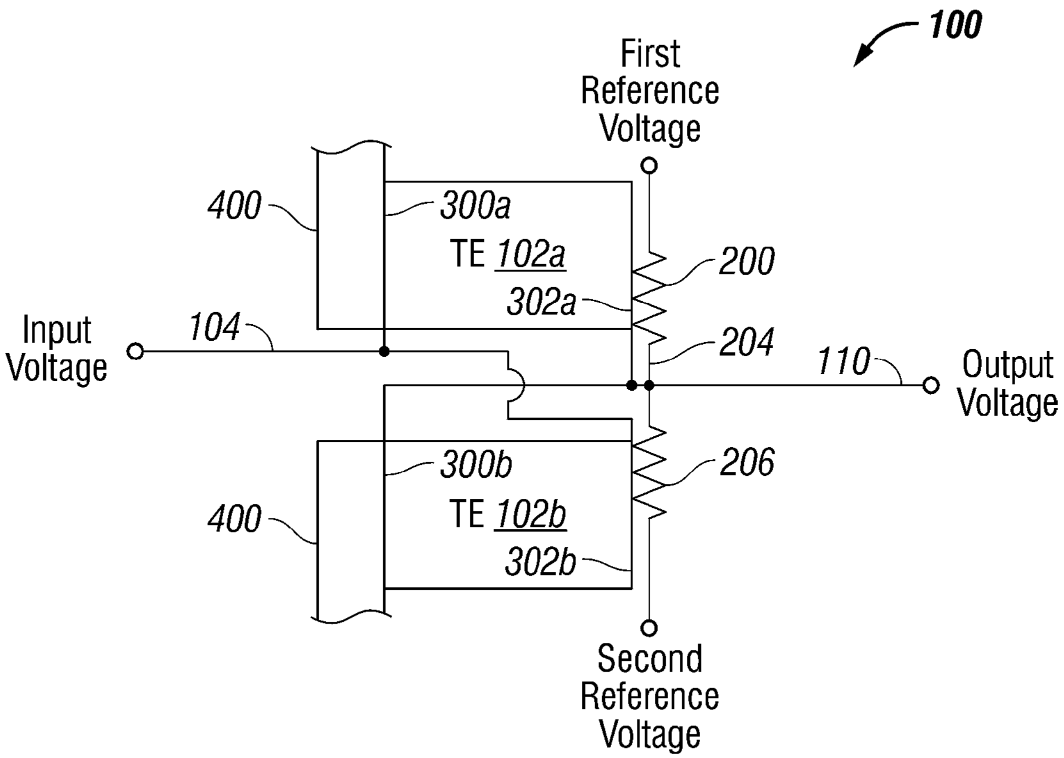

In FIGS. 6C and 6D, one mechanical interface from each TE element is connected to the input voltage and the TE element other mechanical interfaces are electrically connected to the first resistive element second end 204 (line 110). In FIG. 6C, the TE element first mechanical interfaces 300*a* and 300*b* are electrically connected together and the TE element second mechanical interfaces 302*a* and 302*b* are electrically connected together. In FIG. 6D, the first TE element 102*a* first mechanical interface 300*a* is electrically connected to the second TE element 102*b* second mechanical interface 302, and the first TE element 102*a* second mechanical interface 302*a* is electrically connected to the second TE element 102*b* first mechanical interface 300*b*. As shown, mechanical interfaces 300*a* and 302*b* are electrically connected to the input voltage on line 104. Alternately but not shown, interfaces 302*a* and 300*b* may be electrically connected to the input voltage.

The device of FIG. 6C acts similar to the device of FIG. 4. The device of FIG. 6D presents the two resistive elements with different temperatures. For example, an inverter can be made with two positive (or two negative) coefficient thermistors.

Functional Description

As shown in FIG. 4, a simple inverter can be constructed from two thermistors connected in series between the supply voltage and ground. A TE element is thermally coupled to the thermistors and electrically connected to the midpoint of the resistor divider (the output of inverter), and the other TE mechanical interface is connected to the input voltage. FIG. 6C a two-TE element arrangement is presented, where each TE element is thermally coupled to a thermistor, and the other ends of the TEs are connected together as the input. The TEs are connected in parallel and out of phase (hot and cold ends reversed) such that a high voltage at the input causes the TE element thermally coupled to the pull-up resistor (200) to heat up and increase in resistance, and the TE element thermally coupled to the pull-down resistor to cool and reduce in resistance. Thus, the output voltage goes low, inverting. A low voltage at the input causes the reverse and the output switches to high. The device of FIG. 4 is a simpler inverter using thermistors having opposite coefficients of resistance, one positive and one negative. The concepts behind the above-disclosed inverter and buffer designs can be extended to cover other types of logic circuits.

Figure 7:
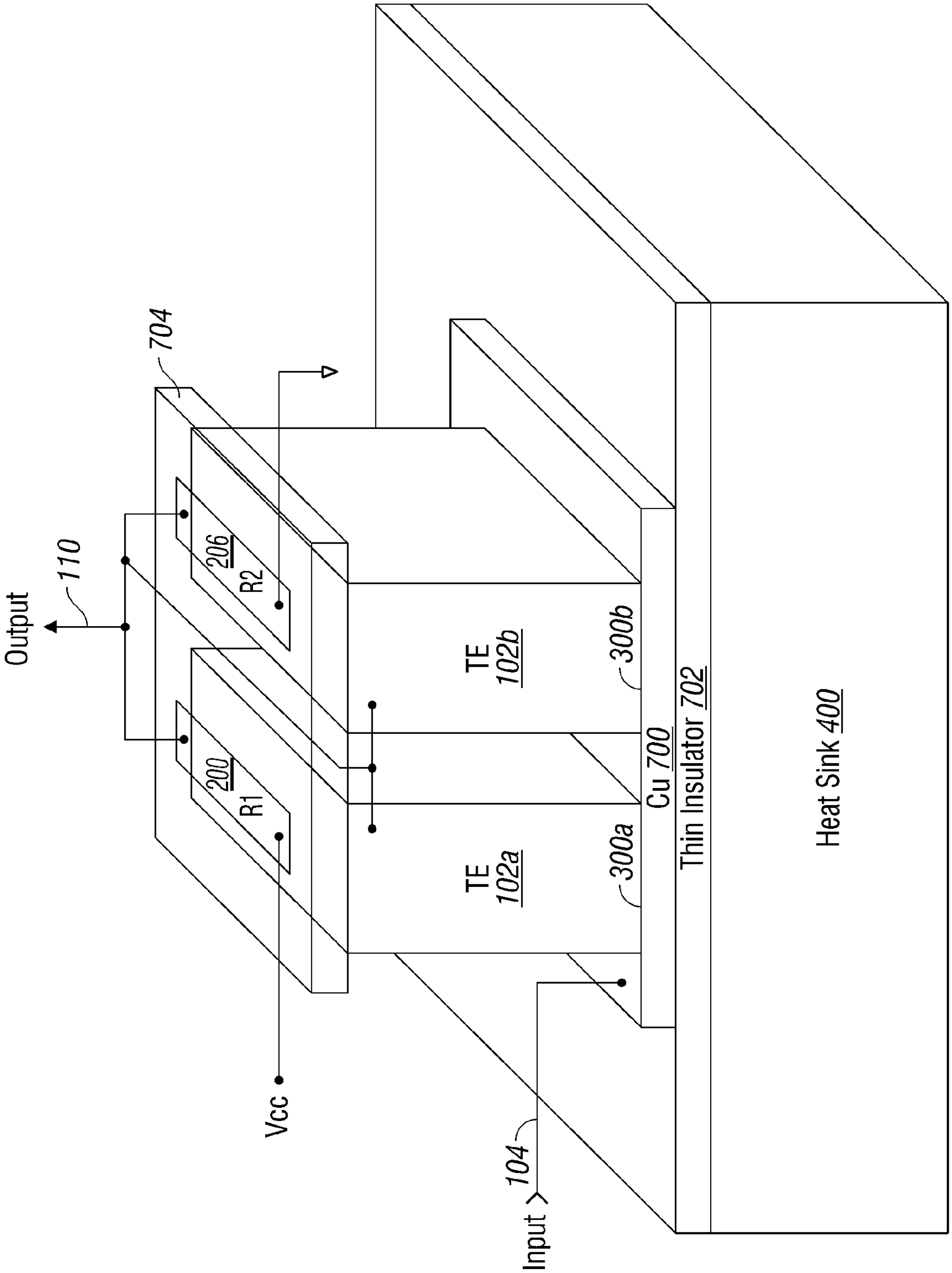
FIG. 7 is a perspective drawing illustrating a simple physical implementation of the device schematically depicted in FIG. 6C.

FIG. 7 is a perspective drawing illustrating a simple physical implementation of the device schematically depicted in FIG. 6C. The heatsink 400 may be Al or Cu, but other metals are known. A highly conductive metal layer 700, made from a material such as Cu, interfaces between the input voltage and the first mechanical interfaces 300*a* and 300*b*. An electrical insulator 702 isolates the input voltage from the heatsink 400. The resistors are made from conventional materials such as nickel, nickel/chrome, and nickel/iron to name a few examples, and are mounted on a thermally conductive electrical insulator 704, made from a material such as thin glass, silicon dioxide, anodized aluminum, or anodized copper to name a few examples.

Figure 8:
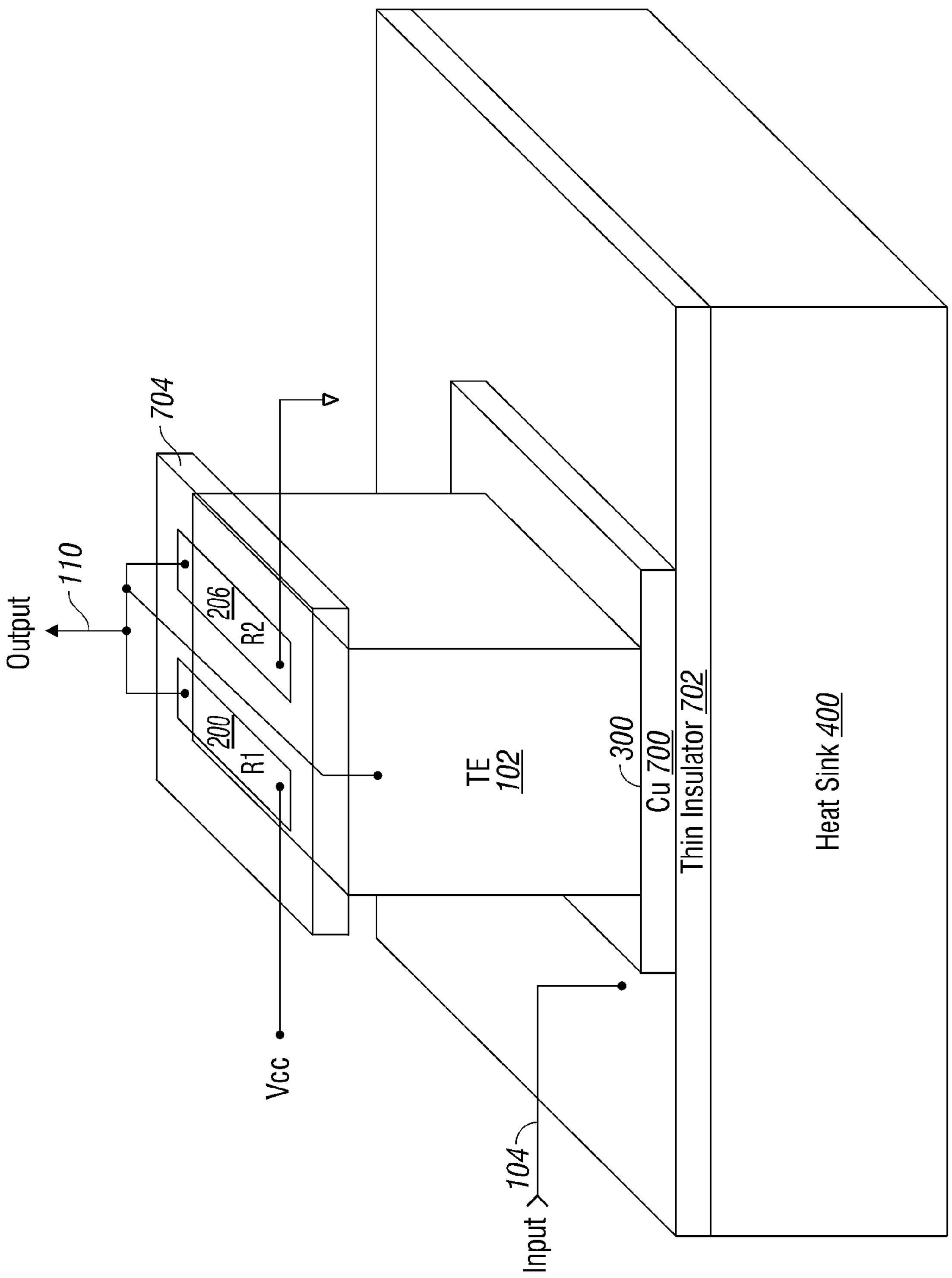
FIG. 8 is a perspective drawing illustrating a simple physical implementation of the device schematically depicted in FIG. 4.

FIG. 8 is a perspective drawing illustrating a simple physical implementation of the device schematically depicted in FIG. 4. The heatsink 400 may be Al or Cu, but other metals are known. A highly conductive metal layer 700, made from a material such as Cu, interfaces between the input voltage and the first mechanical interface 300. A thermally conductive electrical insulator 702 isolates the input voltage from the heatsink 400. The resistors are mounted on a thermally conductive electrical insulator 704.

Figure 9:
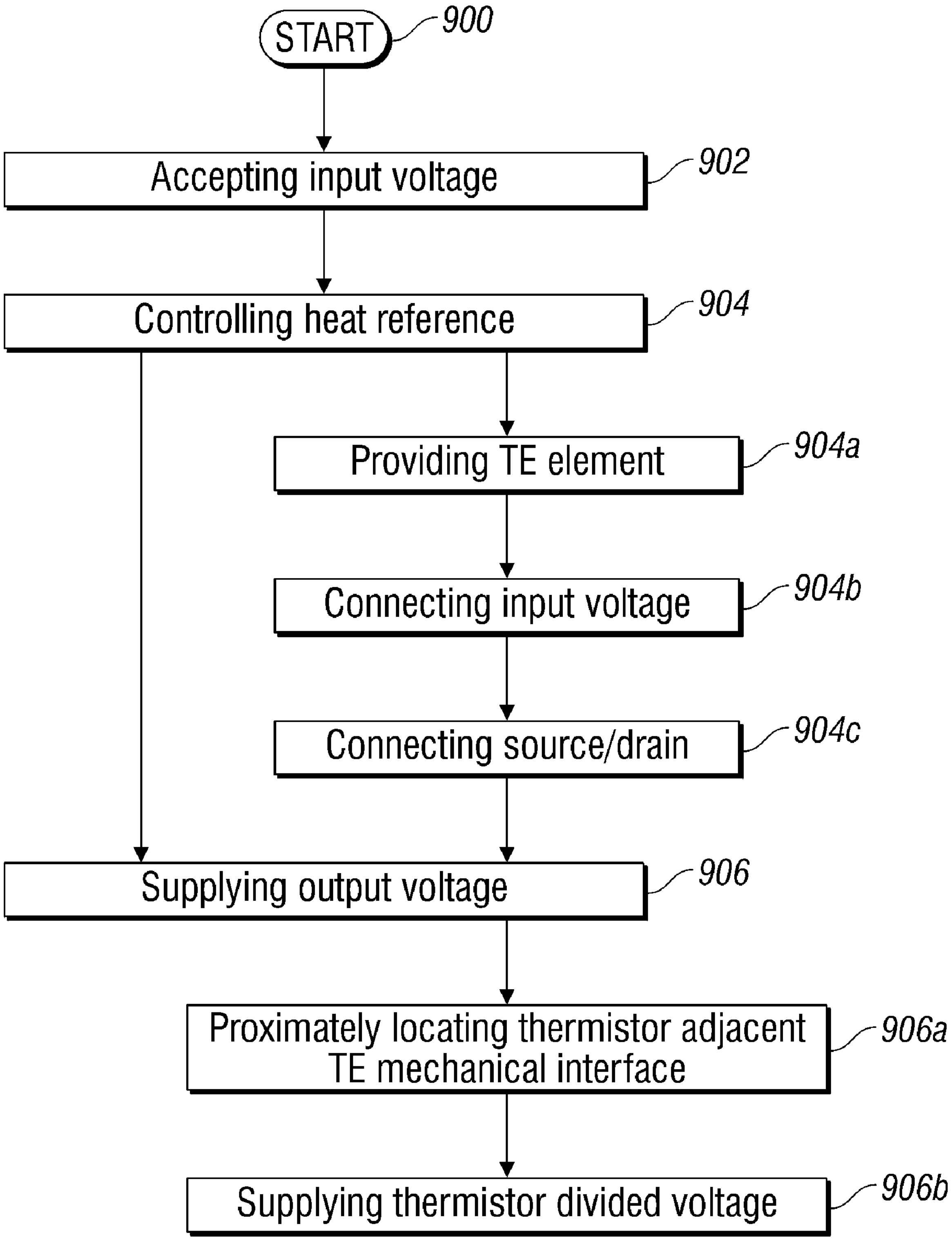
FIG. 9 is a flowchart illustrating a method for thermal electric binary logic control.

FIG. 9 is a flowchart illustrating a method for thermal electric binary logic control. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 accepts an input voltage representing an input logic state. Step 904 controls a heat reference in response to the input voltage. Step 906 supplies an output voltage representing an output logic state, responsive to the heat reference. If Step 902 accepts an input voltage representing a first logic state, then Step 906 supplies an output voltage representing either the first logic state or a second logic state, opposite to the first logic state, depending on whether inverting or non-inverting logic is configured.

In one aspect, supplying the output voltage responsive to the heat reference in Step 906 includes controlling the output voltage of a temperature-sensitive voltage divider. In another aspect, Step 906 controls the output voltage of a thermistor voltage divider.

More explicitly, controlling the heat reference (Step 904) in response to the input voltage includes substeps. Step 904*a* provides a thermal electric element having a first mechanical interface and a second, opposite mechanical interface. Step 904*b* electrically connects the input voltage one of the mechanical interfaces. Step 904*c* electrically connects the opposite mechanical interface to a current source/drain. Then, supplying the output voltage responsive to the heat reference in Step 906 includes substeps. Step 906*a* proximately locates the thermistor voltage divider adjacent to one of the thermal electric element mechanical interfaces. Step 906*b* supplies a thermistor-divided voltage as the output voltage.

A thermal electric binary logic device and method have been provided. Examples of particular schematics and circuit layouts have been given to help explain the invention. However, the invention is not limited to merely these examples. Other variations and embodiments of the invention will occur to those skilled in the art.

I claim:

1. A thermal electric binary logic device comprising:

a thermal electric (TE) element having an electrical interface to accept an input voltage representing an input logic state, and a mechanical interface to supply a temperature responsive to the input voltage, the TE element mechanical interface including a first mechanical interface to supply a first temperature in response to the input voltage, and a second mechanical interface to supply a second temperature in response to the input voltage, different than the first temperature; and, a thermistor element adjacent a TE element mechanical interface selected from a group consisting of the first and second mechanical interfaces, to receive the corresponding temperature, the thermistor element having an output to supply an output voltage representing an output logic state, responsive to received temperature.

2. The logic device of claim 1 wherein the thermistor element is a resistive voltage divider including at least one thermistor.

3. The logic device of claim 2 wherein the resistive voltage divider includes:

a first resistive element having a first end connected to a first reference voltage and a second end to supply the output voltage;

a second resistive element having a first end connected to the first resistive element second end, and a second end connected to a second reference voltage, different from the first reference voltage; and, wherein the thermistor is selected from a group consisting of the first resistive element, the second resistive element, and both the first and second resistive elements.

4. The logic device of claim 3 wherein the TE element electrical interface includes an input electrically connected to one of the TE element mechanical interfaces, and the other mechanical interface: is electrically connected to a current source/drain.

5. The logic device of claim 4 wherein the TE element first mechanical interface is electrically connected to the input voltage and the second mechanical interface is electrically connected to the first resistive element second end.

6. The logic device of claim 4 wherein the TE element other mechanical interface is electrically connected to a current source/drain reference having an intermediate, voltage, approximately midway between an input logic high voltage and an input logic low voltage.

7. The logic device of claim 6 wherein the TE element first mechanical interface is electrically connected to the input voltage.

8. The logic device of claim 6 wherein the TE element second mechanical interface is electrically connected to the input voltage.

9. The logic device of claim 3 wherein the thermistor has a temperature coefficient selected from a group consisting of positive, negative, linear, non-linear, and combinations of the above-mentioned coefficients.

10. The logic device of claim 1 wherein the TE element electrical interface accepts an input voltage representing a first logic state; and, wherein the thermistor element supplies an output voltage representing an output logic state selected from a group consisting of the first logic state and a second logic state, opposite to the first logic state.

11. The logic device of claim 3 wherein the first resistive element is a first thermistor having a temperature coefficient selected from a group consisting of a positive type temperature coefficient and a negative type temperature coefficient; and, wherein the second resistive element is a second thermistor having the same temperature coefficient type as the first thermistor.

12. The logic device of claim 3 wherein the first resistive element is a first thermistor having a temperature coefficient selected from a group consisting of a positive type temperature coefficient and a negative type temperature coefficient; and, wherein the second resistive element is a second thermistor having a temperature coefficient type different than the first thermistor.

13. The logic device of claim 2 wherein the TE element includes a first TE element and a second TE element,: each TE element having a first mechanical interface, to supply a first temperature in response to the input voltage, and a second mechanical interface to supply a second temperature in response to the input voltage, different than the first temperature;

wherein the input voltage is electrically connected to one mechanical interface from each TE element, and the other mechanical interface of each TE element is electrically connected to a current source/drain; and, wherein the resistive voltage divider includes:

a first resistive element adjacent to the first TE element second mechanical interface, having a first end connected to a first reference voltage and a second end to supply the output voltage;

a second resistive element adjacent to the second TE element second mechanical interface, having a first end connected to the first resistive element second end, and a second end connected to a second reference voltage, different from the first reference voltage; and, wherein the thermistor is selected from a group consisting of the first resistive element, the second resistive element, and both the first and second resistive elements.

14. The logic device of claim 13 wherein the TE element first mechanical interfaces are electrically connected together and the TE element second mechanical interfaces are electrically connected together.

15. The logic device of claim 13 wherein the first TE element first mechanical interface is electrically connected to the second TE element second mechanical interface, and the first TE element second mechanical interface is electrically connected to the second TE element first mechanical interface.

16. The logic device of claim 13 wherein the TE element other mechanical interfaces are electrically connected to a current source/drain reference having an intermediate voltage, approximately midway between a logic high input voltage and a logic low input voltage.

17. The logic device of claim 13 wherein the TE element other mechanical interfaces are electrically connected to the first resistive element second end.

18. The logic device of claim 13 wherein the thermistor has a temperature coefficient selected from a group consisting of positive, negative, linear, non-linear, and combinations of the above-mentioned coefficients.

* * * * *